United States Patent
Eldridge et al.

(10) Patent No.: US 11,002,569 B2
(45) Date of Patent: May 11, 2021

(54) ACTUATOR CONTROL SYSTEM UTILIZING CIRCUIT CARD ASSEMBLY

(71) Applicant: Hamilton Sundstrand Corporation, Charlotte, NC (US)

(72) Inventors: Jeffrey A. Eldridge, Ellington, CT (US); Steven A. Avritch, Bristol, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 211 days.

(21) Appl. No.: 15/946,980

(22) Filed: Apr. 6, 2018

(65) Prior Publication Data

US 2019/0310110 A1    Oct. 10, 2019

(51) Int. Cl.
| | |
|---|---|
| *G01D 5/22* | (2006.01) |
| *G05B 13/02* | (2006.01) |
| *H02P 29/00* | (2016.01) |
| *H05K 1/14* | (2006.01) |
| *H02P 25/06* | (2016.01) |
| *H02P 25/066* | (2016.01) |
| *H02P 13/10* | (2006.01) |
| *H02P 8/00* | (2006.01) |

(52) U.S. Cl.
CPC ......... *G01D 5/2291* (2013.01); *G05B 13/021* (2013.01); *H02P 8/00* (2013.01); *H02P 8/005* (2013.01); *H02P 13/10* (2013.01); *H02P 25/06* (2013.01); *H02P 25/066* (2016.02); *H02P 29/00* (2013.01); *H05K 1/14* (2013.01)

(58) Field of Classification Search
CPC .......... H02P 25/066; H02P 8/00; H02P 8/005; H02P 13/10; H02P 25/06; H02P 29/00; G05B 13/021; H05K 1/14
See application file for complete search history.

(56) References Cited

U.S. PATENT DOCUMENTS

| | | | |
|---|---|---|---|
| 5,493,497 A | 2/1996 | Buus | |
| 9,242,576 B1* | 1/2016 | Turnbull | B60L 15/20 |
| 9,862,365 B2 | 1/2018 | Al-Tabakha | |
| 2009/0278761 A1* | 11/2009 | Makinen | H01P 1/184 |
| | | | 343/904 |

(Continued)

FOREIGN PATENT DOCUMENTS

| | | |
|---|---|---|
| EP | 0830726 A1 | 3/1998 |
| EP | 3029819 A1 | 6/2016 |

OTHER PUBLICATIONS

European Search Report for European Patent Application No. 19167411.8, completed Jul. 11, 2019.

*Primary Examiner* — Said Bouziane
(74) *Attorney, Agent, or Firm* — Carlson, Gaskey & Olds, P.C.

(57) ABSTRACT

An example actuator control system includes a variable differential transformer (VDT) configured to measure displacement of a motor, and a motor controller configured to control the motor based on displacement data from the VDT. A circuit card assembly (CCA) interconnects the VDT to the motor controller. The CCA includes memory storing configuration data of the VDT, and the CCA is configured to provide the configuration data to the motor controller to calibrate the motor controller for use of the VDT. A method of configuring a motor controller is also disclosed.

20 Claims, 5 Drawing Sheets

(56) References Cited

U.S. PATENT DOCUMENTS

| | | | |
|---|---|---|---|
| 2010/0242492 A1* | 9/2010 | Sloat | F02C 7/12 |
| | | | 60/793 |
| 2011/0210210 A1* | 9/2011 | Lebrun | H02P 6/16 |
| | | | 244/194 |
| 2016/0164448 A1* | 6/2016 | Kane | H02P 27/06 |
| | | | 318/400.24 |
| 2016/0226349 A1* | 8/2016 | Mastrocola | H02K 11/21 |
| 2016/0329798 A1 | 11/2016 | Himmelmann | |
| 2017/0063276 A1* | 3/2017 | Zhi | G01R 31/343 |
| 2017/0241810 A1* | 8/2017 | Keohane | H02K 24/00 |
| 2017/0280617 A1* | 10/2017 | Biery, II | A01C 7/203 |
| 2018/0001844 A1 | 1/2018 | Eldridge et al. | |
| 2019/0206565 A1* | 7/2019 | Shelton, IV | G16H 40/63 |

* cited by examiner

1

ACTUATOR CONTROL SYSTEM UTILIZING CIRCUIT CARD ASSEMBLY

BACKGROUND

This application relates to circuit card assemblies (CCAs), and more particularly to a CCA that provides configuration data of a variable differential transformer (VDT) to a motor controller.

A linear actuator is used to provide axial movement and move a component attached to the linear actuator to a desired position. A linear variable differential transformer (LVDT) is a type of variable differential transformer that can be used to measure linear displacement of a LVDT core that is movable along a central longitudinal axis of the LVDT. A LVDT core can be mechanically coupled to a forcer rod of a linear actuator to measure movement of the forcer rod. The LVDT includes a plurality of windings that wind around the core, including a primary winding that is disposed between two secondary windings.

An LVDT output can be used to measure displacement of the LVDT core by associating specific output signal values with particular positions of the core. When the primary winding is energized from an alternating current (AC) excitation signal, a magnetic field is provided that induces a voltage in the secondary windings. The position of the core determines how tightly the signal of the primary coil is coupled to each of the secondary coils. The two secondary coils are series-opposed, which means wound in series but in opposite directions. This results in the induced signals on each secondary winding being 180° out of phase. Therefore, a phase difference between the induced signals indicates a direction of movement of the core, and an amplitude of the induced signals indicates a distance that the core has moved.

A control device that reads the output of an LVDT needs to be calibrated to associate certain LVDT output signal values with certain LVDT core positions (e.g., signal value for core fully retracted, signal value for core fully extended, and signal value for core in an intermediate "zero" position). Various factors, such as LVDT tolerances and signal return paths, can cause these values to differ between similarly configured LVDTs. For technicians configuring machines to use LVDTs, these values either have to be learned in a calibration process performed by the technician, or manually programmed into controller memory based on manufacturer data, both of which are cumbersome, time consuming, and error prone.

SUMMARY

An example actuator control system includes a variable differential transformer (VDT) configured to measure displacement of a motor, and a motor controller configured to control the motor based on displacement data from the VDT. A circuit card assembly (CCA) interconnects the VDT to the motor controller. The CCA includes memory storing configuration data of the VDT, and the CCA is configured to provide the configuration data to the motor controller to calibrate the motor controller for use of the VDT.

An example actuator system includes an actuator and a plurality of motors configured to cooperatively operate the actuator. A plurality of VDTs are each configured to measure displacement of a respective one of the motors. A plurality of motor controllers are each configured to control a respective one of the motors based on data from the VDT associated with the motor. A plurality of CCAs each include memory storing configuration data of a respective one of the VDTs. Each CCA is configured to provide the configuration data of the respective VDT to the motor controller associated with the VDT to calibrate the motor controller for use of the VDT.

An example method of configuring a motor controller includes interconnecting a VDT to a motor controller through a removable CCA, wherein the VDT is configured to measure displacement of a motor, and the motor controller is configured to control the motor based on displacement data from the VDT. The method includes transmitting predefined configuration data of the VDT from memory of the CCA to the motor controller to calibrate the motor controller for use of the VDT.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION

Figure 1:
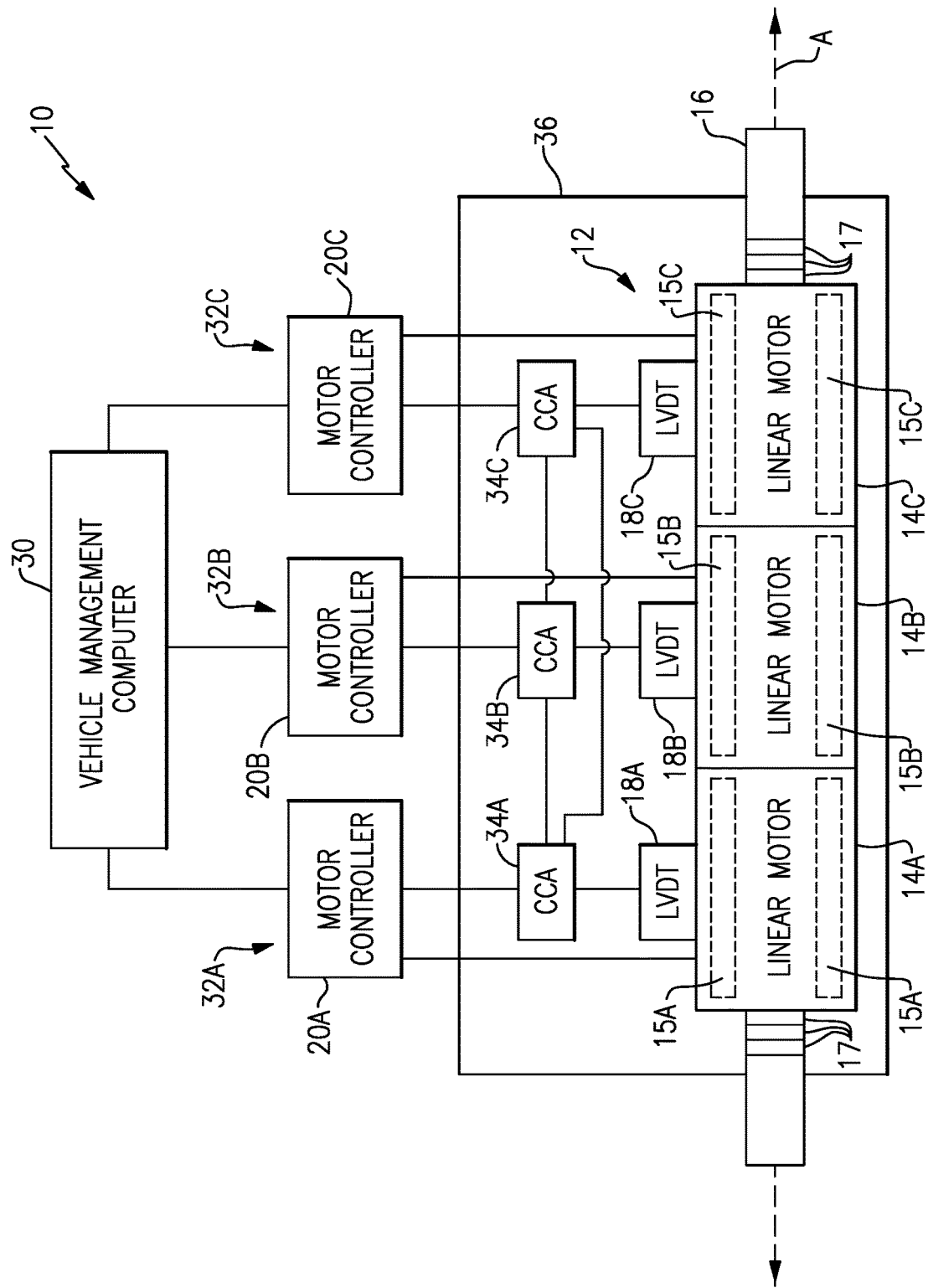
FIG. 1 is a schematic view of an actuator system.

FIG. 1 is a schematic view of an example actuator system 10 that includes a linear actuator 12 and a plurality of linear motors 14A-C. Each of the linear motors 14 includes at least one respective stator 15.

The linear actuator 12 includes a forcer rod 16 that extends along a central longitudinal axis A. A plurality of magnets 17 surround the forcer rod 16 along a length of the forcer rod 16.

The forcer rod 16 is movable along the central longitudinal axis A by applying a voltage to one or more of the stators 15. If a voltage is provided in each of the three stators 15A-C, they can cooperatively move the rod along the longitudinal axis A. If one of the linear motors 14A-C is unavailable, the remaining ones of the linear motors 14A-C can increase their output to compensate for the unavailable motor. The rotor of each linear motor 14A-C corresponds to a portion of the forcer rod 16 and the portion's surrounding magnets 17.

A plurality of LVDTs 18A-C are redundantly configured to measure a linear displacement of the forcer rod 16. Each LVDT 18 is associated with a respective one of the linear motors 14A. In the example of FIG. 1, linear motor 14A is associated with LVDT 18A, linear motor 14B is associated with LVDT 18B, and linear motor 14C is associated with LVDT 18C.

The system 10 includes a plurality of motor controllers 20A-C that are each operable to control a respective, associated one of the linear motors 14A-C. Each motor controller 20 receives displacement data about its associated linear motor 14 from the LVDT 18 associated with that motor 14, and is configured to control its associated linear motor 14 based on the displacement data.

A vehicle management computer 30 is in communication with the plurality of motor controllers 20A and is operable to provide actuator commands that the motor controllers 20A-C carry out.

Each motor controller 20 has a respective control lane 32 that is utilized for sending signals to its associated linear motor 14 and obtaining displacement data from its associated LVDT 18.

The actuator system 10 includes a plurality of circuit card assemblies (CCAs) 34A-C. Each CCA 34 includes a printed circuit board on which a circuit, including circuit components, is provided. Each CCA 34 is connected to the CCA 34 of another control lane 32 to provide for communication between the control lanes 32.

Each CCA 34 includes memory storing predefined configuration data of its associated LVDT 18, and is configured to provide that configuration data to the motor controller 20 associated with that LVDT 18 to calibrate the motor controller 20 for use of the LVDT 18. In one example, each CCA 34 is configured to provide the configuration data to the motor controller 20 at startup of the actuator system 10 in a calibration process of the motor controller 20. This enables the motor controller 20 to self-configure itself based on the configuration data, and avoids the manual configuration process of the prior art.

A housing 36 is provided that at least partially encloses the linear motors 14, LVDTs 18, and CCAs 34. The plurality of motor controllers 20 are outside the housing 36 and are spaced apart from the housing 36.

In one example, the housing 36 and its contents are provided from a vendor as a self-contained unit, which provides for convenient automatic configuration of each motor controller 20A-C when connected to the CCAs 34 and linear motors 14.

Figure 2:
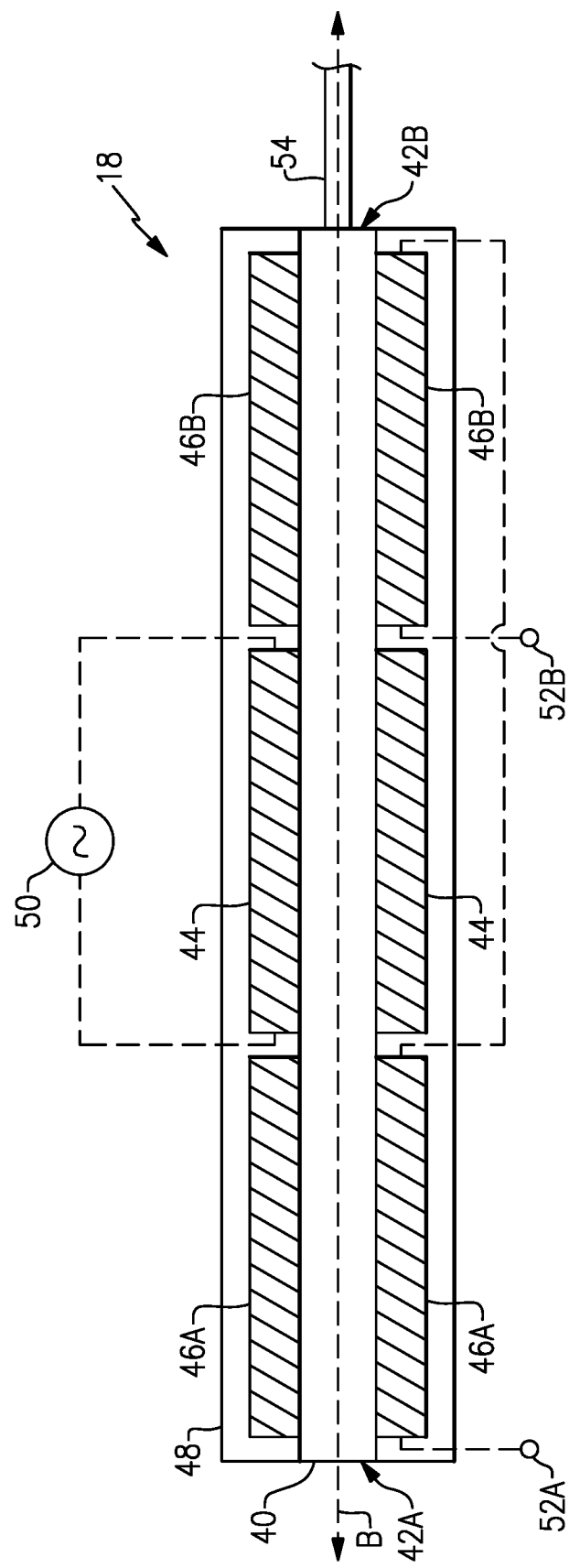
FIG. 2 is a schematic view of an example LVDT that may be used in the actuator system of FIG. 1.

Referring now to FIG. 2, an example LVDT 18 is shown. The LVDT 18 includes a core 40 that extends between opposing ends 42A-B of the LVDT 18 and is moveable along a central longitudinal axis B of the LVDT 18. The central longitudinal axis B is parallel to the central longitudinal axis A of FIG. 1. A plurality of windings 44, 46A, 46B wind around the core 40. The winding 44 is a primary winding, and is situated axially between secondary windings 46A, 46B. A shield 48 surrounds the windings 44 and 46A-B to minimize an effect of electromagnetic interference (EMI) from the forcer rod 16 on the LVDT 18. The two secondary windings 46A-B are series-opposed, which means they are wound in series but in opposite directions.

A power source 50 is connected to opposing ends of the winding 44. When the power source 50 energizes the primary winding 44, a magnetic field is provided that induces a voltage in the secondary windings 46A, 46B. Because the two secondary windings 46A-B are series-opposed, their induced signals are 180° out of phase with each other.

An extension rod 54 extends from one end of the core 40 and is mechanically coupled to the forcer rod 16, such that axial movement of the forcer rod 16 along central longitudinal axis A causes linear movement of the LVDT core 40 along central longitudinal axis B in the same direction and by a same distance.

As the LVDT core 40 moves linearly along central longitudinal axis B, a magnetic field within the LVDT 18 changes, which changes the phase and amplitude of the output signal of the LVDT 18. The motor controller 20 associated with the LVDT 18 is connected to the output terminals 52A-B and is configured to measure the output signal and determine a linear position of the core 40 based on the output signal.

The configuration data stored in each CCA 34 includes LVDT 18 output values for predefined linear positions of the core 40 (e.g., fully extended, fully retracted, and an intermediate position). These baseline values calibrate the motor controller 20 for the specific values of its associated LVDT 18, enabling the motor controller 20 to accurately determine the position of its associated LVDT core 40, and correspondingly the position of the forcer rod 16. In one example, the configuration data includes LVDT "rigging data" corresponding to a plurality of predefined positions of the LVDT core 40, and LVDT alignment constants corresponding to electrical output values of the LVDT 18 at those predefined positions. Such configuration information is also known as "trim data" or "personality data" for the LVDT 18.

Figure 3:
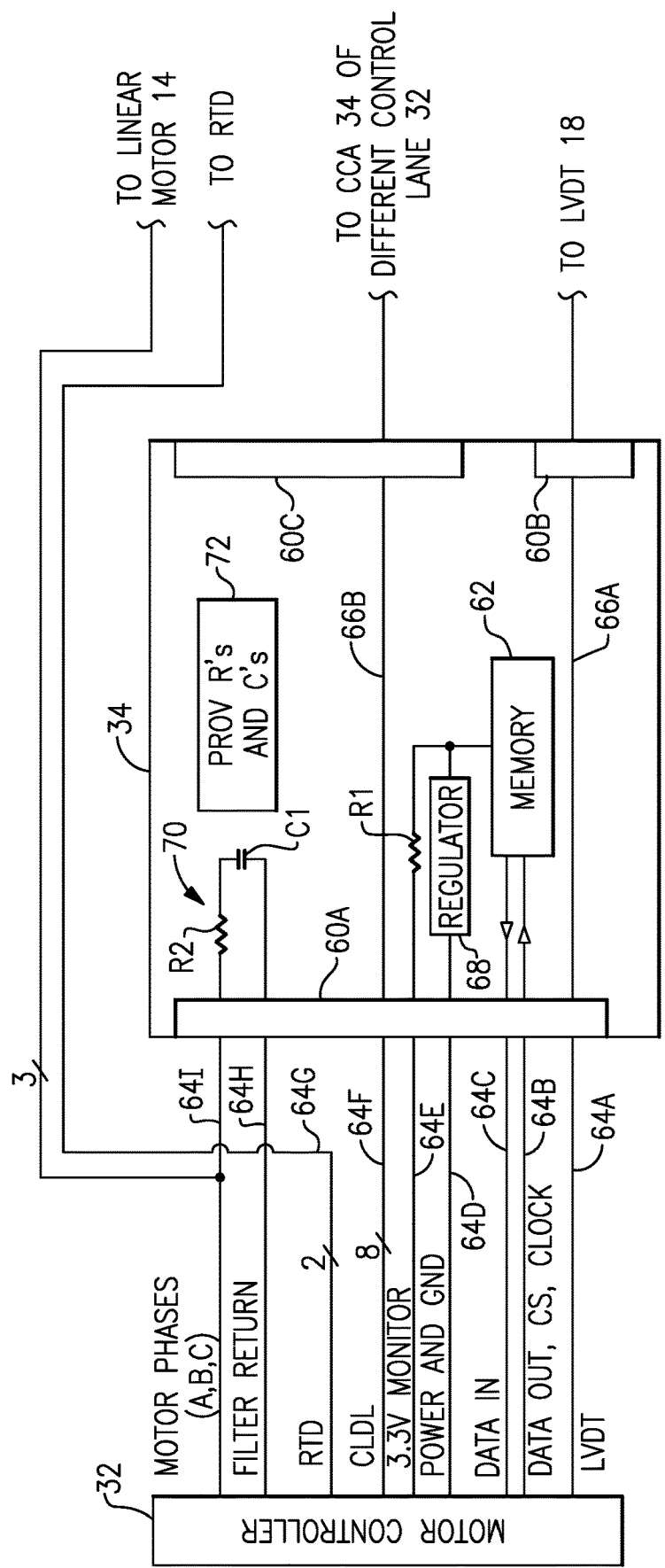
FIG. 3 is a schematic view of an example circuit card assembly (CCA) that may be used in the actuator system of FIG. 1.

FIG. 3 is a schematic view of an example CCA 34 that may be used in the actuator system 10 of FIG. 1. The CCA 34 includes a plurality of ports 60A-C. Port 60A connects to the motor controller 20 of the CCA's control lane 32, port 60B connects to the LVDT 18 of the CCA's control lane 32, and port 60C connects to the CCA 34 of another control lane 32. In one example, the ports 60 are serial ports.

The CCA 34 includes memory 62 that stores predefined configuration data of its associated LVDT 18. The configuration data could include any of the following, for example: the displacement range of its associated linear motor 14, the gains to be used by the motor controller 20 in a control algorithm for the associated linear motor 14 ("control law gains"), predefined linear positions for the associated LVDT 18, and LVDT 18 output values corresponding to the predefined linear positions. In one example, the memory 62 also stores a fault history of its associated linear motor 14 based on data received from its associated motor controller 20. The fault history could include specific fault codes along with a date and time of fault occurrences. In one example, the memory 62 also stores data indicative of an amount of time that the associated linear motor 14 has been in service. In one example, the memory 62 comprises an electronically erasable programmable read-only memory (EEPROM) chip.

The motor controller 20 includes a plurality of signaling lines 64A-I that connect to the port 60A. Although each signaling line 64 is depicted as a single line in FIG. 3, it is understood that each of the signaling lines 64 could include multiple lines (e.g., for multi-bit communications).

Signaling line 64A is configured to communicate with and/or power LVDT 18 via feedthrough line 66A.

Signaling line 64B is configured to provide a data output, chip select, and clock signal from the motor controller 20 to the memory 62.

Signaling line 64C is configured to provide data from the memory 62 to the motor controller 20.

Signaling line 64D is configured to provide a power and ground signal from the motor controller 20 to a regulator circuit 68 the CCA 34. The regulator circuit 68 regulates a voltage used to power the memory 62. A resistor R1 is connected to signaling line 64E, which enables the motor controller 20 to monitor the voltage delivered to the memory 62.

Signaling line 64F, which may include eight lines for eight bit communications, connects to the port 60C of another CCA 34 via feed through line 66B and provides a cross-lane data link (CLDL).

Signaling line 64G bypasses the CCA 34 and connects to a resistive thermal device "RTD" (not shown) for monitoring a temperature of the linear motor 14 associated with the motor controller 20. In one example, signaling line 64G includes at least two lines to determine RTD data.

Signaling line 64H provides a filter return to the motor controller 20 from a resistor-capacitor filter 70.

Signaling line 64I provides an output for the motor controller 20 to control the linear motor 14. In one example, signaling line 64I includes three lines, one for each winding of the linear motor 14. Signaling line 64I also connects to the RC circuit 70 for EMI filtering.

The RC filter 70 provides for electromagnetic interference (EMI) reduction of the power signal delivered to the various phases of the linear motor 14 over signaling line 64I. The RC filter 70 includes at least one resistor R2 and at least one capacitor C1. In one example, the RC filter 70 includes at least one resistor R2 and at least one capacitor C1 for each of a plurality of phase of the power signal delivered over a plurality of the signaling lines 64I (e.g., three phases and three lines). Additional resistors and/or capacitors can be added to the RC filter(s) 70 as desired to adjust the filtering. In one example, additional resistors and capacitors are stored in a storage area 72 of the CCA 34.

The CCA 34 provides a convenient way to interconnect a given linear motor 14 to its associated motor controller 20, and to provide for communication between control lanes 32. The CCA 34 also provides for convenient self-configuration of a motor controller 20, which reduces the opportunity for the LVDT configuration data to be misconfigured by a technician, such as during initial deployment or field replacement of a LVDT 18. If a LVDT 18 needs to be replaced, a new CCA 34 that is preloaded with that configuration data can be quickly swapped out, providing for minimal downtime of the actuator system 10. Alternatively, the previous configuration data stored in the memory 62 for the replaced LVDT 18 can be overwritten with configuration data for the new LVDT 18. Because it is removable, the CCA 34 can be conveniently swapped out or removed for updating, for example. Still further, the CCA 34 provides a convenient way to retain data about a fault history of a given motor.

Although LVDTs are described above, the actuator system 10 discussed above could also be used for other types of variable differential transformers, such as rotary variable differential transformers (RVDTs), and the memory 62 of the CCA 34 could include configuration data for the RVDT.

In this disclosure, like reference numerals designate like elements where appropriate and reference numerals with the addition of one-hundred or multiples thereof designate modified elements that are understood to incorporate the same features and benefits of the corresponding elements.

Figure 4A:
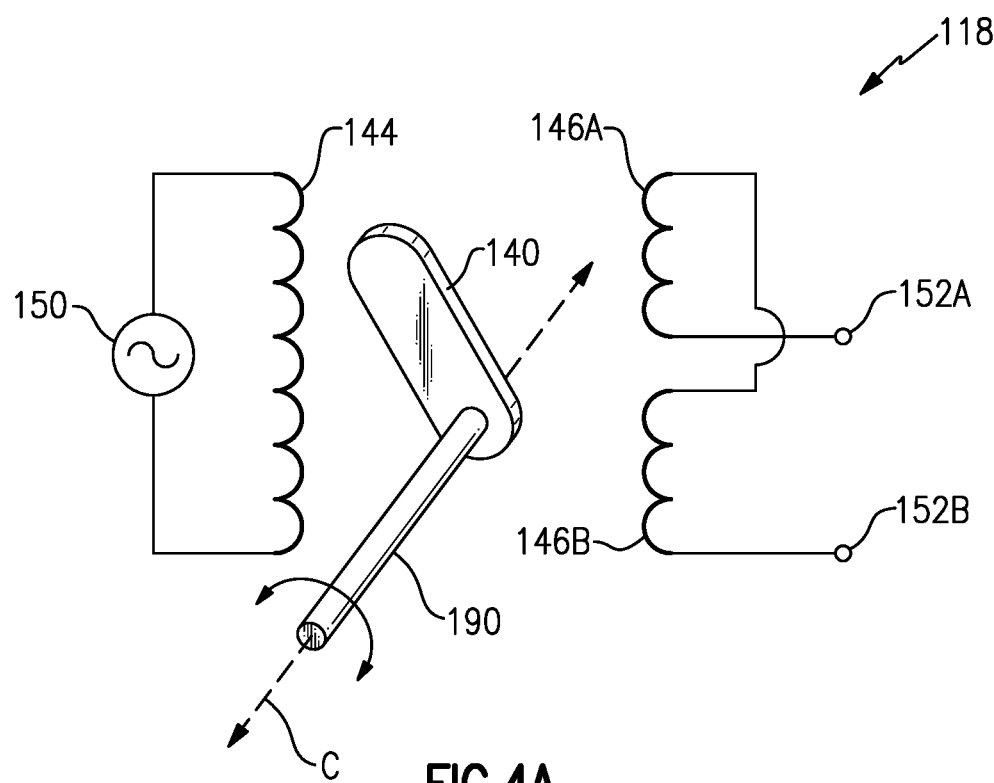
FIG. 4A is a first schematic view of an example rotational variable differential transformer (RVDT) configured to measure rotational displacement of a stepper motor.

FIG. 4A is a first schematic view of an example RVDT 118 that is configured to measure rotational displacement. The RVDT 118 includes a magnetic core 140 connected to a shaft 190 that is generally perpendicular to the core 140. The shaft 190 and core 140 are configured to corotate about a longitudinal axis C. The RVDT 118 includes a primary winding 144 and two secondary windings 146A-B. A power source 150 is connected to opposing ends of the winding 144. When the power source 150 energizes the primary winding 144, a magnetic field is provided that induces a voltage in the secondary windings 146A, 146B. As the RVDT core 140 rotates about longitudinal axis C, a magnetic field within the RVDT 118 changes and alters an output signal of the two secondary windings 146A-B, which is measurable using terminals 152A-B to determine a rotational displacement of the RVDT core 140.

Figure 4B:
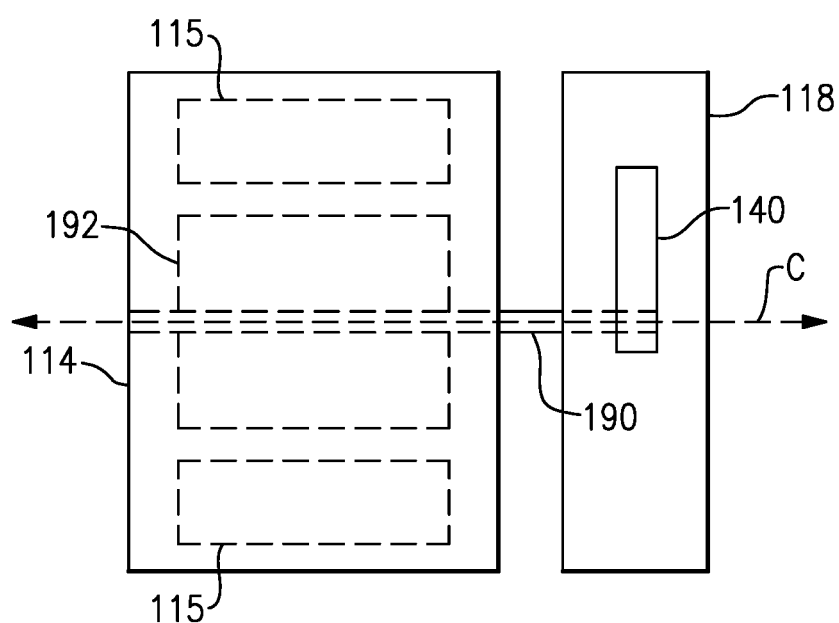
FIG. 4B is a second schematic view of the example RVDT of FIG. 4A.

FIG. 4B is a schematic view of the RVDT 118 adjacent to an example stepper motor 114. The stepper motor 114 includes at least one stator 115 and at least one rotor (shown schematically as 192) coupled to the shaft 190. The at least one stator 115 is configured to provide a magnetic field that rotates the at least one rotor 192, which causes rotation of the shaft 190. The at least one rotor 192 and core 140 are both coupled to the shaft 190 and corotate about the longitudinal axis C. Through this corotation, the RVDT 118 is configured to measure rotational displacement of the stepper motor 114. In one example, the stepper motor 114 has a predefined range of rotation (e.g., ±60°). Similar to what is illustrated in FIG. 1, a plurality of RVDTs 118 could be used to measure displacement of a plurality of stepper motors 114 that cooperatively rotate a common shaft.

Figure 5:
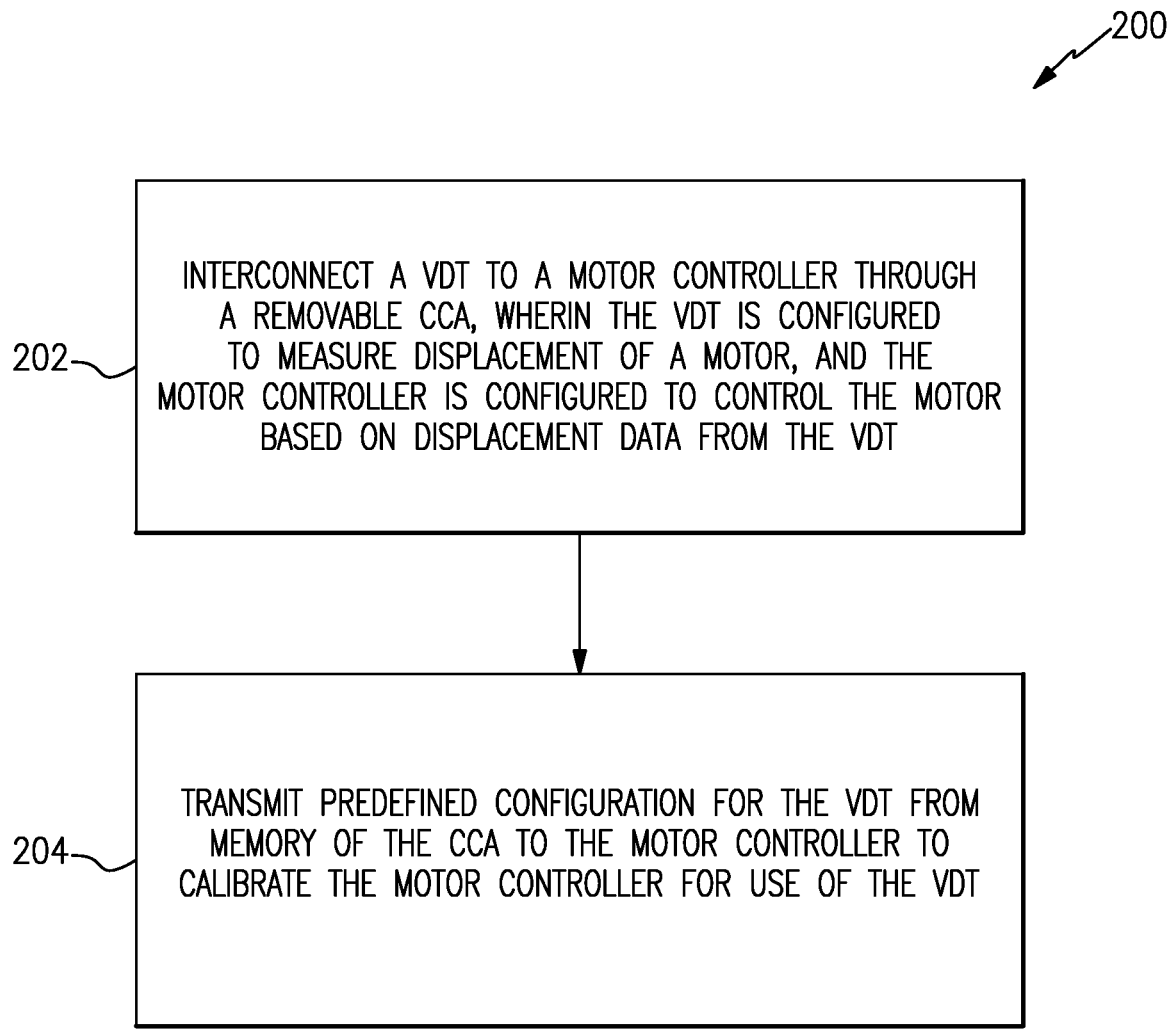
FIG. 5 summarizes an example method of configuring a motor controller in a flowchart diagram.

FIG. 5 summarizes an example method of configuring a motor controller in a flowchart diagram 200. A VDT (e.g., LVDT 18 or RVDT 118) is interconnected to a motor controller 20 through a removable CCA 34 at 202. The VDT is configured to measure displacement of a motor (e.g., linear motor 14 or stepper motor 114), and the motor controller 20 is configured to control the motor based on displacement data from the VDT. Predefined configuration data for the VDT is transmitted from memory 62 of the CCA 34 to the motor controller 20 to calibrate the motor controller 20 for use of the VDT at 204.

The motor controller 20 provides a power signal to the motor based on the predefined configuration data and based on displacement data from the VDT. A filter circuit 70 of the CCA 34 is utilized to reduce electromagnetic interference (EMI) in the power signal.

Although example embodiments have been disclosed, a worker of ordinary skill in this art would recognize that the description is illustrative rather than limiting. Certain modifications would come within the scope of the disclosed embodiments. For that reason, the following claims should be studied to determine the scope and content of legal protection.

What is claimed is:

1. An actuator control system, comprising:
  a variable differential transformer (VDT) configured to measure displacement of a motor;
  a motor controller configured to control the motor based on displacement data from the VDT; and
  a circuit card assembly (CCA) that is separate from the VDT and motor controller and that provides a communication link between the VDT and motor controller by interconnecting a signaling line of the VDT to a signaling line of the motor controller, the CCA comprising memory storing configuration data of the VDT, the CCA configured to provide the configuration data to the motor controller to calibrate the motor controller for use of the VDT.

2. The actuator control system of claim 1, wherein the configuration data comprises VDT output values associated with predefined positions of a moveable core of the VDT.

3. The actuator control system of claim 1, wherein the CCA is configured to store a fault history of the motor in the memory based on data received from the motor controller.

4. The actuator control system of claim 1, wherein the CCA is configured to store data in the memory that is indicative of an amount of time that the motor has been in service.

5. The actuator control system of claim 1, wherein:
  the motor is configured to operate an actuator;
  the motor controller, VDT, and CCA correspond to a first control lane of the actuator; and the CCA is configured to relay data to other control lanes of the actuator.

6. The actuator control system of claim 5, wherein the CCA comprises:
   a first port that connects the CCA to the motor controller;
   a second port that connects the CCA to the VDT; and
   a third port that connects the CCA to a CCA of a different control lane.

7. The actuator control system of claim 1, wherein the CCA comprises a filter circuit configured to reduce electromagnetic interference (EMI) in a power signal provided by the motor controller to the motor.

8. The actuator control system of claim 7, wherein the filter circuit comprises a separate resistor-capacitor circuit for each phase of the power signal.

9. The system of claim 1, wherein the VDT comprises a linear VDT and the motor comprises a linear motor.

10. An actuator system, comprising:
    an actuator;
    a plurality of motors configured to cooperatively operate the actuator;
    a plurality of variable differential transformers (VDTs), each configured to measure displacement of a respective one of the motors;
    a plurality of motor controllers, each configured to control a respective one of the motors based on data from the VDT associated with the motor; and
    a plurality of circuit card assemblies (CCAs), each separate from the plurality of VDTs and plurality of motor controllers, and each comprising memory storing configuration data of a respective one of the VDTs, each CCA configured to:
       provide the configuration data of the respective VDT to the motor controller associated with the VDT to calibrate the motor controller for use of the VDT; and
       interconnect a signaling line of the VDT to a signaling line of the motor controller, the interconnection providing a communication link between the VDT and the motor controller.

11. The actuator system of claim 10, comprising:
    a housing;
    wherein the actuator, plurality of motors, plurality of VDTs, and CCAs are situated in the housing; and
    wherein the plurality of motor controllers are situated outside of the housing and are spaced apart from the housing.

12. The actuator system of claim 10, wherein:
    each associated motor controller, VDT, and CCA correspond to a respective control lane of the actuator; and
    each CCA is configured to relay data from its control lane to a CCA of another of the control lanes.

13. The actuator system of claim 12, wherein each CCA comprises:
    a first port that connects the CCA to the associated motor controller;
    a second port that connects the CCA to the associated VDT; and
    a third port that connects the CCA to a CCA of a different control lane.

14. The actuator system of claim 10, wherein the configuration data of each VDT comprises VDT output values associated with predefined positions of a moveable core of the VDT.

15. The actuator system of claim 10, wherein each CCA is configured to store a fault history of its associated motor in its memory based on data received from the motor controller.

16. The actuator system of claim 10, wherein each CCA is configured to store data in its memory indicative of an amount of time that its associated motor has been in service.

17. The actuator system of claim 10, wherein each CCA comprises a filter circuit configured to reduce electromagnetic interference (EMI) in a power signal provided by its associated motor controller to its associated motor.

18. The actuator system of claim 17, wherein each filter circuit comprises a separate resistor-capacitor circuit for each phase of the power signal from its associated motor controller.

19. A method of configuring a motor controller, comprising:
    interconnecting a signaling line of a variable differential transformer (VDT) to a signaling line of a motor controller through a removable circuit card assembly (CCA) that is separate from the VDT and motor controller, wherein the VDT is configured to measure displacement of a motor, and the motor controller is configured to control the motor based on displacement data from the VDT, and wherein the interconnection provides a communication link between the VDT and the motor controller; and
    transmitting predefined configuration data of the VDT from memory of the CCA to the motor controller to calibrate the motor controller for use of the VDT.

20. The method of claim 19, comprising:
    providing a power signal from the motor controller to the motor based on the predefined configuration data and displacement data from the VDT; and
    utilizing a filter circuit of the CCA to reduce electromagnetic interference (EMI) in the power signal.

* * * * *